(12) United States Patent
Paek

(10) Patent No.: US 7,638,246 B2
(45) Date of Patent: Dec. 29, 2009

(54) PHOTO DEVELOPMENT APPARATUS AND METHOD FOR FABRICATING A COLOR FILTER SUBSTRATE USING THE SAME

(75) Inventor: Seung Han Paek, Incheon (KR)

(73) Assignee: LG Display Co., Ltd., Seoul (KR)

( * ) Notice: Subject to any disclaimer, the term of this patent is extended or adjusted under 35 U.S.C. 154(b) by 895 days.

(21) Appl. No.: 11/152,093

(22) Filed: Jun. 15, 2005

(65) Prior Publication Data

US 2006/0003238 A1    Jan. 5, 2006

(51) Int. Cl.
*G02B 5/20* (2006.01)
(52) U.S. Cl. .......................... 430/7; 430/326
(58) Field of Classification Search ........ None
See application file for complete search history.

(56) References Cited

U.S. PATENT DOCUMENTS

2001/0030721 A1* 10/2001 Z. et al. ...................... 349/110

FOREIGN PATENT DOCUMENTS

| JP | 61-39041 | 2/1986 |
|----|----------|--------|
| JP | 6-337308 | 12/1994 |
| JP | 10-307405 | 11/1998 |
| JP | 2001-183824 | 7/2001 |
| JP | 2002-258479 | 9/2002 |
| JP | 2003-043685 A * | 2/2003 |
| JP | 2004-109968 | 4/2004 |
| KR | 2007-0028767 A * | 3/2007 |

OTHER PUBLICATIONS

Computer-generated translation of JP 2003-043685 (Feb. 2003).*
Abstract of KR 2007-0028767 (Mar. 2007).*
Computer-generated translation of KR 2007-0028767 (Mar. 2007).*

* cited by examiner

*Primary Examiner*—John A. McPherson
(74) *Attorney, Agent, or Firm*—Morgan Lewis & Bockius LLP

(57) ABSTRACT

A photo development apparatus for use in fabricating a color filter substrate for a display panel is disclosed. The disclosed photo apparatus includes a development solution supplier to supply a negative development solution. The photo apparatus also includes a first photo apparatus to form a positive photo-resist pattern to be used in forming a black matrix, wherein the positive photo-resist pattern is formed by patterning a light shielding layer formed on a substrate using the negative development solution and a positive photo-resist.

15 Claims, 5 Drawing Sheets

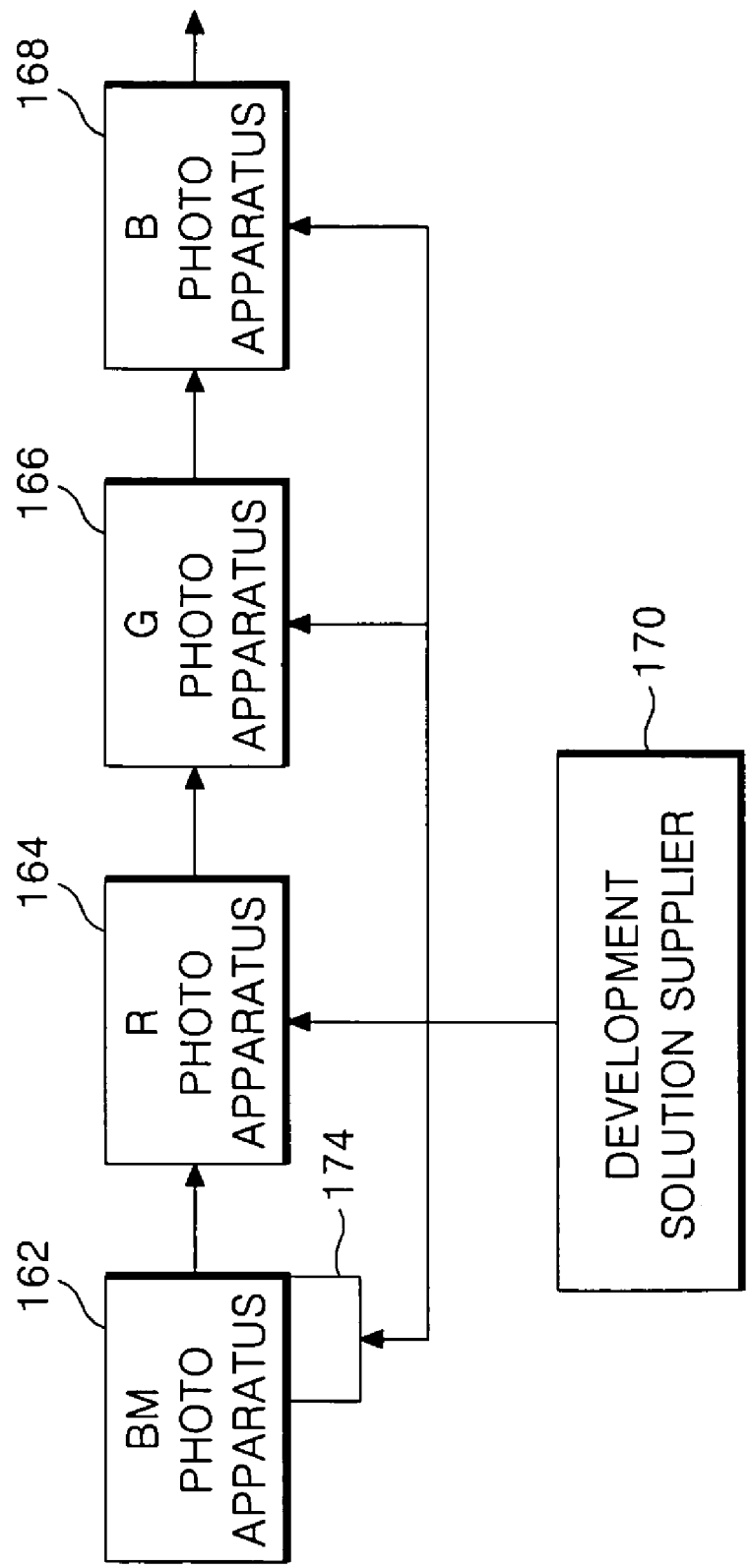

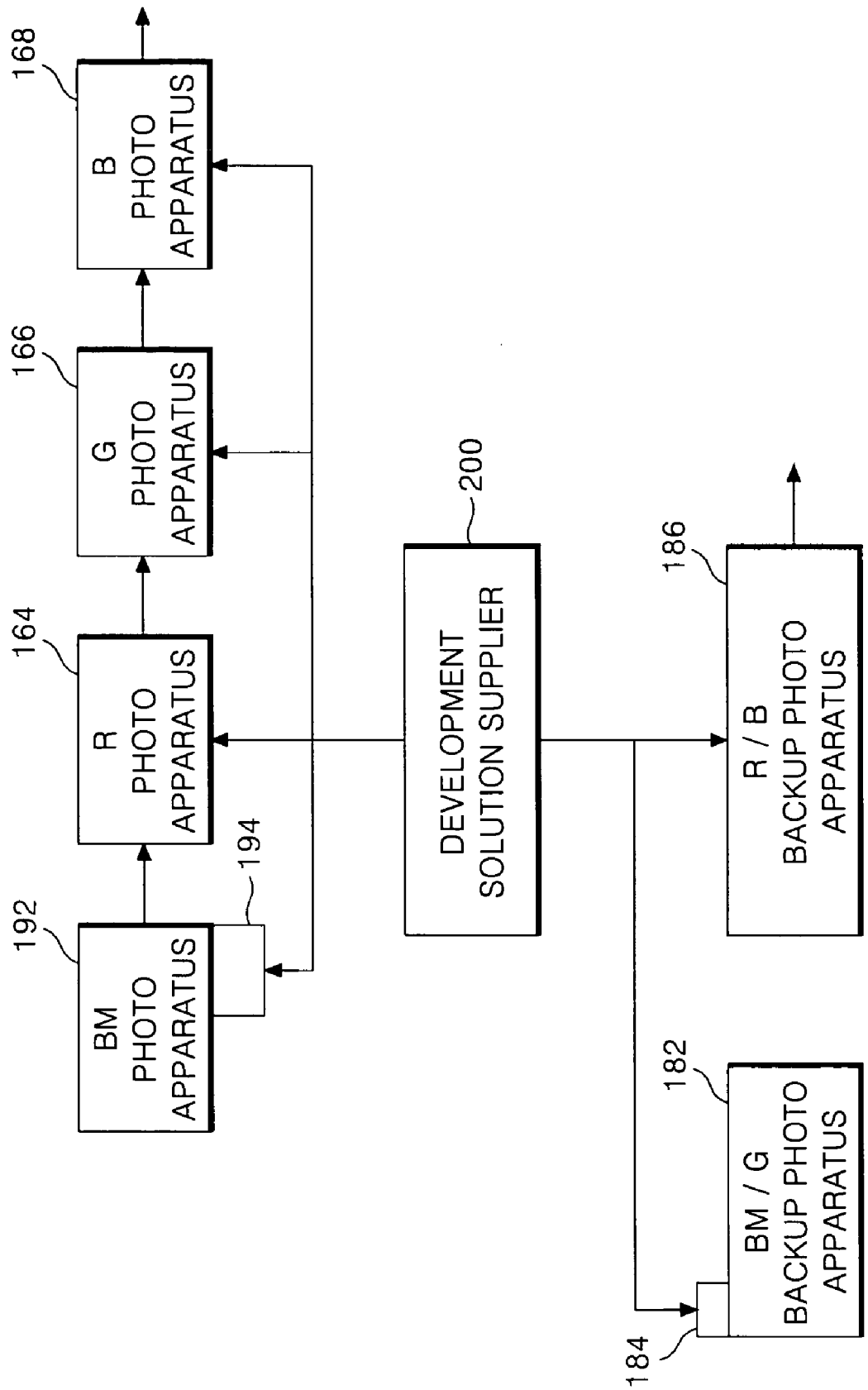

PHOTO DEVELOPMENT APPARATUS AND METHOD FOR FABRICATING A COLOR FILTER SUBSTRATE USING THE SAME

This application claims the benefit of the Korean Patent Application No. P2004-50701 filed on Jun. 30, 2004, which is hereby incorporated by reference.

BACKGROUND OF THE INVENTION

1. Field of the Invention

The present invention relates to a photo development apparatus and a method for fabricating a display panel using the same, and more particularly, to a photo development apparatus and a method for fabricating a color filter substrate for a display panel using the same.

2. Description of the Related Arts

A liquid crystal display device controls the light transmissivity of liquid crystal, which has dielectric anisotropy, by the use of an electric field, thereby displaying a picture. For this, the liquid crystal display device includes a liquid crystal display panel to display a picture through a liquid crystal cell matrix and a drive circuit to drive the liquid crystal display panel.

As shown in FIG. 1, a liquid crystal display panel of the related art includes a color filter substrate 10 and a thin film transistor substrate 20 which are bonded together with liquid crystal 24 therebetween.

The color filter substrate 10 includes a black matrix 4, a color filter 6 and a common electrode 8, which are sequentially formed on an upper glass substrate 2. The black matrix 4 is formed on the upper glass substrate in a matrix shape. The black matrix 4 divides the area of the upper glass substrate 2 into a plurality of cell areas in which a color filter is to be formed, and prevents the optical interference and external light reflection between the adjacent cells. The color filter 6 is formed to be divided into red R, green G, blue B in the cell area divided by the black matrix 4 to transmit red, green and blue lights, respectively. The transparent common electrode 8, which spreads over the entire surface of the color filter 6, supplies a common voltage Vcom as a reference voltage for driving the liquid crystal 24. In addition, to flatten the color filter 6, an overcoat layer (not shown) is formed between the color filter 6 and the common electrode 8.

The thin film transistor substrate 20 includes a thin film transistor 18 and a pixel electrode 22, wherein the thin film transistor 18 is formed in every cell area which is defined by the intersection of a gate line 14 and a data line 16 on a lower glass substrate 12. The thin film transistor 18 supplies a data signal from the data line 16 to the pixel electrode 22 in response to a gate signal from the gate line 14. The pixel electrode 22 formed of a transparent conductive layer supplies the data voltage from the thin film transistor 18 to drive the liquid crystal 24.

The liquid crystal 24 having a dielectric anisotropy rotates along the electric field formed by the common voltage Vcom of the common electrode 8 and the data voltage of the pixel electrode 22 to control the light transmissivity, thereby creating a corresponding gray level image.

The liquid crystal display panel further includes a spacer (not shown) to maintain a fixed cell gap between the color filter substrate 10 and the thin film transistor substrate 20. The spacer is a ball spacer or a column spacer. The column spacer is mainly used for a large sized liquid crystal display panel. The column spacer is mainly used in a method of forming liquid crystal by a drop-filling and is mainly formed on the overcoat layer that covers the color filter.

The color filter substrate 10 and the thin film transistor substrate 20 of the liquid crystal display panel are formed by use of a plurality of mask processes. One fabrication method includes a plurality of processes such as a thin film deposition (coating) process, a cleaning process, a photolithography process (hereinafter, referred to as a "photo process"), an etching process, a photo-resist peeling process, an inspection process and so on.

The photo process progresses in the order of coating a photo-resist, exposure, development, and firing. Here, the photo-resist has a photo sensitivity and can be patterned by the exposure process. The photo-resist is classified as a positive type or a negative type in accordance with its characteristics. The positive photo-resist and the negative photo-resist should each be developed with different development solutions. Generally, the positive photo-resist is a resin of Novolak type, and a TMAH development solution is used. The negative photo-resist is a resin of acrylic type, and a KOH development solution is used. If these two development solutions are mixed even in a small amount, the photo-resist phenomenon is not generated properly. Thus, there is a problem in that the two types of photo-resists cannot be used in one photo apparatus at the same time.

In other words, in the event that both the positive photo-resist and the negative photo-resist are to be used, separate photo apparatuses are needed for processing the positive photo-resist and processing the negative photo-resist. Further, a development solution supply apparatus which supplies development solutions to each photo apparatus should also include separate apparatuses for supplying a positive development solution and supplying a negative development solution.

For example, in the color filter substrate, a positive photo-resist is used for the black matrix and a negative photo-resist is used for the color filters. Further, a negative photo-resist is used for the overcoat layer and the column spacer. A negative photo-resist is also used for the resin black matrix which is mainly used for a horizontal electric field application type of liquid crystal display panel. Accordingly, there is a disadvantage in that the equipment operation rate decreases when operating a backup apparatus because a positive photo apparatus and a negative photo apparatus are separately needed, and the positive development solution supply apparatus and the negative development solution supply apparatus are separately needed to form the color filter substrate. The fabricating apparatus and method for the color filter substrate of the related art are explained with reference to FIGS. 2 and 3.

FIG. 2 is a block diagram illustrating a photo development apparatus used in fabricating a color filter substrate according to the related art. FIG. 3 is a diagram illustrating, step by step, a related art process of forming the color filter substrate with the use of the fabricating apparatus shown in FIG. 2.

The photo development apparatus of the color filter substrate shown in FIG. 3 includes a BM photo apparatus 62 to form the black matrix, and R, G, and B photo apparatuses 64, 66, and 68 to form R, G, and B color filters, respectively. The photo development apparatus also includes a first development solution supplier 70 to supply a positive development solution to the BM photo apparatus 62, and a second development solution supplier 72 to supply a negative development solution to the R, G, and B photo apparatuses 64, 66, and 68.

As shown in FIG. 3, in the first step S1, a Cr layer 32 is formed on an upper glass substrate by a separate deposition apparatus (not shown). In the second step S2, a BM photo apparatus 62 forms a photo-resist pattern 34 on the Cr layer 32 by a photo process using a first mask. The BM photo apparatus 62 coats a positive photo-resist on the Cr layer 32 and exposes it through a first mask, and then it develops the positive photo-resist using the positive development solution from the first development solution supplier 70, thereby forming a photo-resist pattern 34. In the third step S3, a separate etching apparatus (not shown) etches the Cr layer 32 by an etching process using the photo-resist pattern 34 as a mask to form a black matrix 40. Then, a strip apparatus (not shown) removes the photo-resist pattern 34 left on the black matrix 40.

In the fourth step S4, the R photo apparatus 64 forms an R color filter in a corresponding pixel area of a substrate 30 where the black matrix 40 is formed. The R photo apparatus 64 coats an R photo-resist having an R pigment on the substrate 30 where the black matrix 40 is formed and exposes it. The R photo apparatus 64 then develops the R photo-resist by using the negative development solution from the second development supplier 72, thereby forming the R color filter.

In the fifth step S5, the G photo apparatus 66 forms a G color filter in a corresponding pixel area by the same photo process as in step S4, and in the sixth step S6, the B photo apparatus 68 forms a B color filter in a corresponding pixel area by the same photo process.

In the seventh step S7, a common electrode deposition apparatus (not shown) forms a common electrode 42 which covers the R, G, B color filter.

In the event that the color filter substrate having a resin black matrix is fabricated with the use of the related art photo development apparatus, because the BM photo apparatus 62 of the positive type shown in FIG. 2 cannot be used for the negative type, the BM photo apparatus of the negative type is separately provided. However, the BM photo apparatuses of the positive type and of negative type need to stop operating from time to time to make their production quantity match that of the R, G, and B photo apparatus 64, 66, and 68. Accordingly, there is a problem in that the operation rate of two BM photo apparatuses decreases by 50% so that their productivity decreases.

Further, with respect to providing a backup photo apparatus for improving productivity, a backup apparatus of the positive type and a backup apparatus of the negative type are separately needed. For example, a method may utilize one backup BM photo apparatus of the positive type and one backup color photo apparatus of the negative type to produce the R, G, and B color filters in a sequential manner in order to use a minimum number of backup apparatuses. In this case, however, while the BM photo backup apparatus is used to form the black matrix, the color photo backup apparatus should form the R, G, and B color filters. Thus, the production imbalance between the backup apparatuses is created so that the productivity increases by only one third of the basic photo development apparatus production.

SUMMARY OF THE INVENTION

Accordingly, the present invention is directed to a photo development apparatus and a method for fabricating a color filter substrate of a display panel using the photo development apparatus that substantially obviate one or more of problems due to limitations and disadvantages of the related art.

An object of the present invention is to provide a photo development apparatus and a method for fabricating a color filter substrate of a display panel using the photo development apparatus that are adaptive for maximizing its production even with a minimum number of backup photo apparatuses.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other objects of the invention, a photo development apparatus for use in fabricating a color filter substrate for a display panel includes a development solution supplier to supply a negative development solution, and a first photo apparatus to form a positive photo-resist pattern to be used in forming a black matrix, wherein the positive photo-resist pattern is formed by patterning a light shielding layer formed on a substrate using the negative development solution and a positive photo-resist.

In another aspect, a method of fabricating a color filter substrate for a display panel, includes: forming a light shielding layer on a substrate; forming a positive photo-resist including an acrylic group resin and a novolak group resin on the light shielding layer; exposing portions of the positive photo-resist using a mask; supplying a first negative development solution; supplying a second negative development solution by controlling a concentration of the first negative development solution; forming a positive photo-resist pattern by developing the exposed portions of the positive photo-resist with the second negative development solution; and forming a black matrix by patterning the light shielding layer using the positive photo-resist pattern.

In yet another aspect of the present invention, a method of fabricating a plurality of color filter substrates for display panels, includes: forming a light shielding layer on a first substrate; forming a positive photo-resist including an acrylic group resin and a novolak group resin on the light shielding layer; exposing portions of the positive photo-resist using a mask; supplying a first negative development solution; supplying a second negative development solution by controlling a concentration of the first negative development solution; forming a positive photo-resist pattern by developing the exposed portions of the positive photo-resist with the second negative development solution; forming a black matrix by patterning the light shielding layer using the positive photo-resist pattern, forming a black resin layer on a second substrate; forming a negative photo-resist on the black resin layer; exposing portions of the negative photo-resist using a mask; and developing the exposed portions of the negative photo-resist with the first negative development solution to form a black matrix on the second substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 4 is a block diagram of a photo development apparatus for use in fabricating a color filter substrate according to a first exemplary embodiment of the present invention; and FIG. 5 is a block diagram of a photo development apparatus for use in fabricating a color filter substrate according to a second exemplary embodiment of the present invention.

DETAILED DESCRIPTION OF THE PREFERRED EMBODIMENTS

Figure 1:
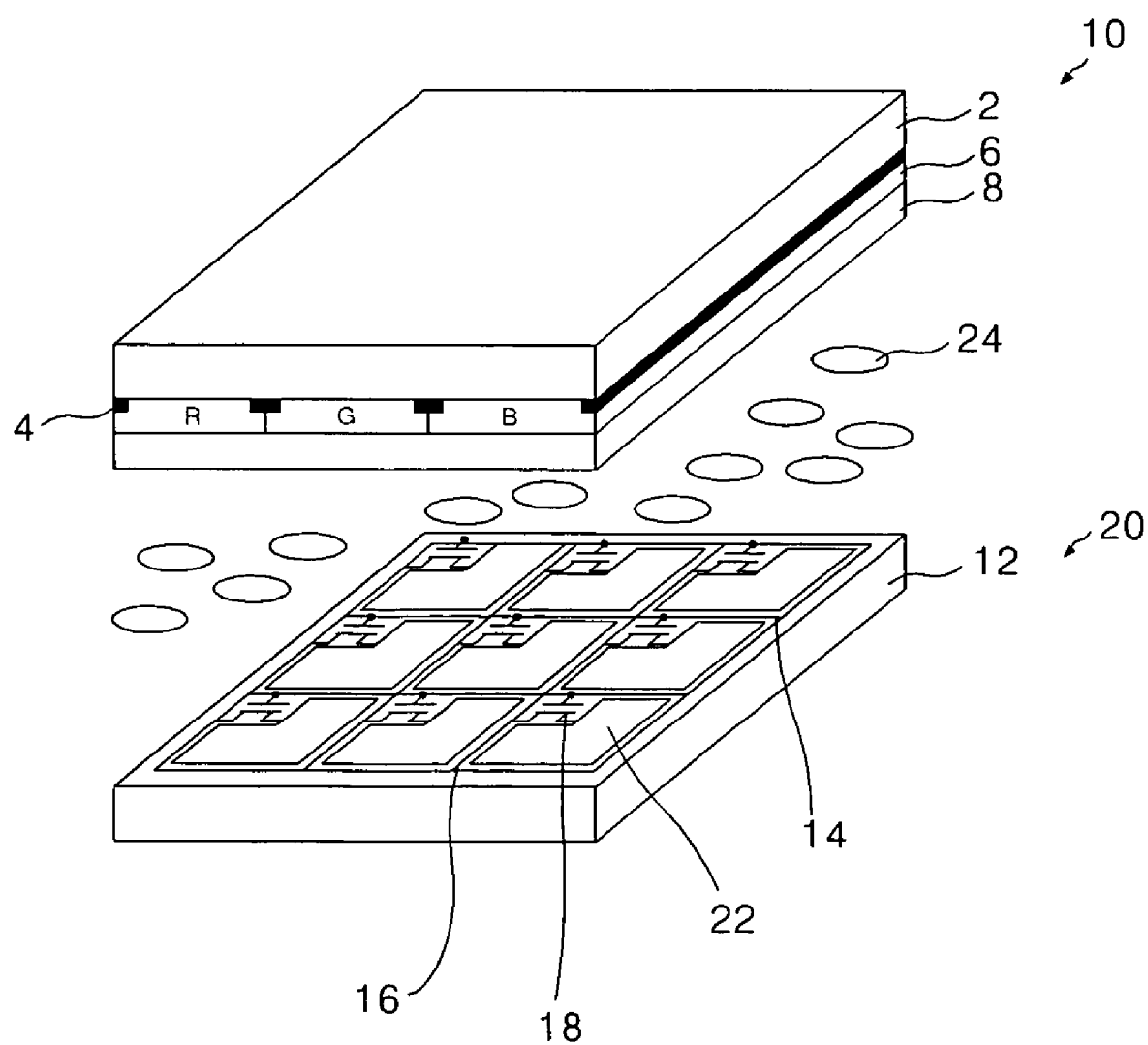
FIG. 1 is a perspective view illustrating a related art liquid crystal display panel structure.
Figure 2:
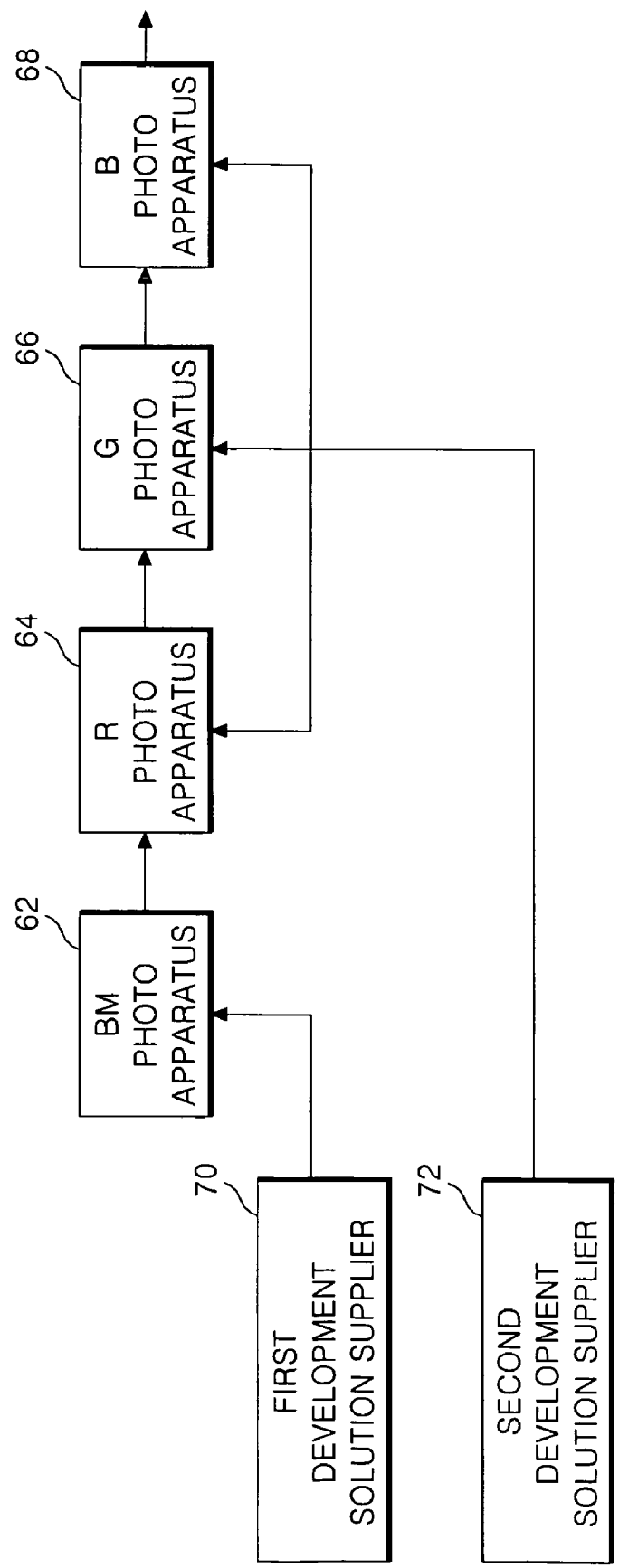
FIG. 2 is a block diagram of a related art photo development apparatus for fabricating a color filter substrate.
Figure 3:
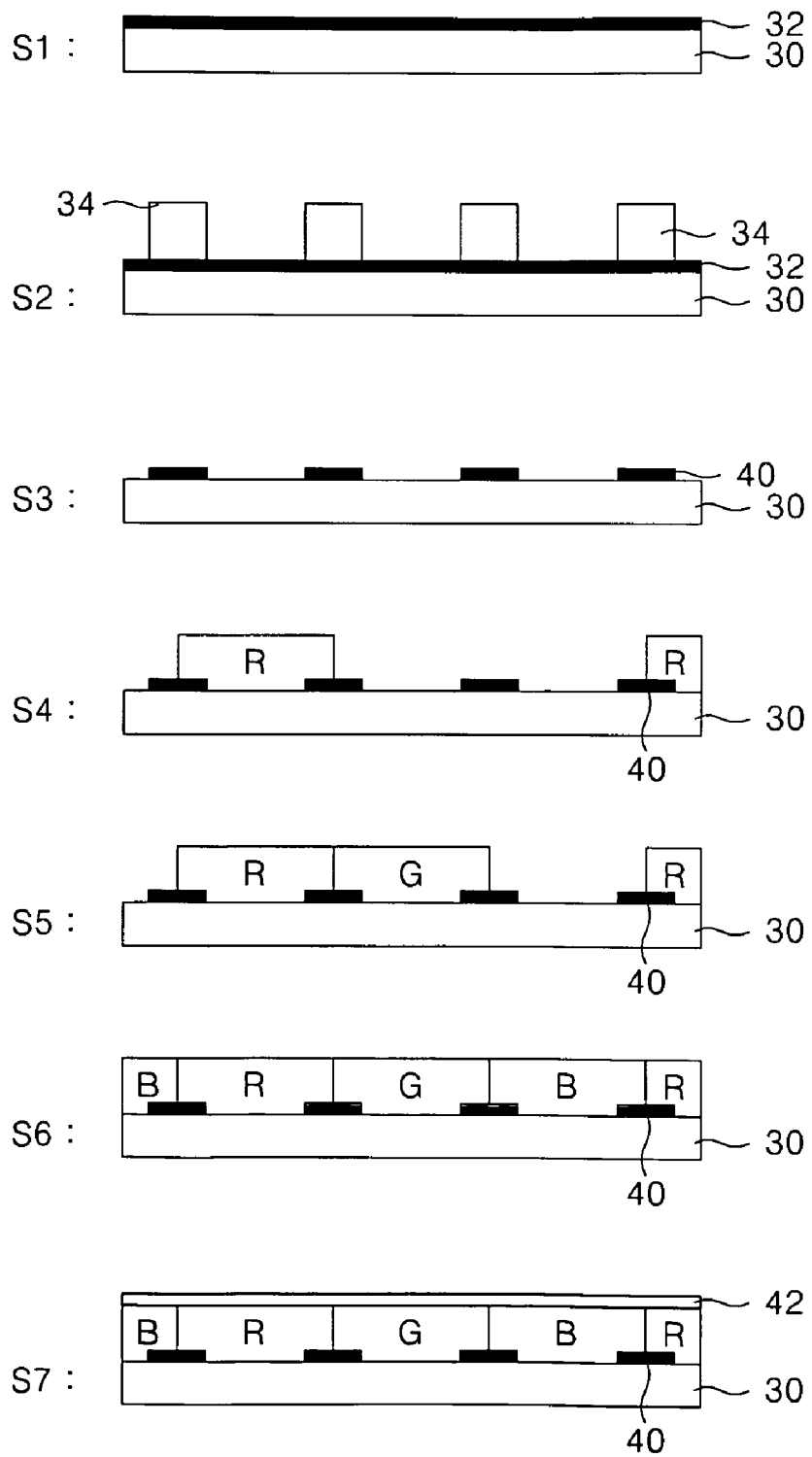
FIG. 3 is a sectional diagram illustrating a method of fabricating a color filter substrate using the photo development apparatus shown in FIG. 2.

Reference will now be made in detail to the preferred embodiments of the present invention, examples of which are illustrated in the accompanying drawings.

The present invention uses a method of unifying a development solution so that a positive photo-resist and a negative photo-resist can be processed together by the same photo apparatus. As the unified development solution, a KOH group development solution, which is cheap and mainly used as a negative photo-resist development solution, can be used. The composition of the positive type photo-resist needs to be changed to unify the development solution to the KOH group. As the positive photo-resist, a novolak group resin can be used as a base in view of its low manufacturing cost and its process application, and an acrylic resin can be added to reduce a development defect because the development defect can be generated when using only a single novolak group resin. If the acrylic resin ratio is too high, there are problems in that its residual layer ratio may decrease, a bad strip defect can be generated, and the material cost increases due to the high cost of the acrylic resin. On the other hand, if the acrylic resin ratio is too low, the development property by the KOH group development solution may decrease to generate a pattern defect. Thus a proper mixture ratio of the novolak group resin and the acrylic resin is preferred.

As the composition ratio of the positive photo-resist of the present invention, the appropriate ratio of solid contents to a solvent is about 24~28% to about 72~76%. The appropriate ratio of the novolak group resin to the acrylic resin among the solid contents is about 1 to about 0.4~0.6. For example, when the novolak resin is about 14% in the whole photo-resist, the appropriate acrylic resin ratio is about 14%. The composition of the positive photo-resist and the composition ratio thereof are shown in the following Table 1.

TABLE 1

| Positive PR composition | Composition ratio |
|---|---|
| Novolak group resin | 12~17% |
| Acrylic group resin | 5~10% |
| PAC | 3~5% |
| Solvent | 77~82% |

In the above Table 1, a photo active compound PAC determines the positive characteristic of the photo-resist along with the novolak group resin, and it disconnects the link between molecules when exposing to make the exposed part easily removable by the development solution. Herein, a material for the solvent uses the well-known any solvent material. For instance, propylene glycol monomethyl ether acetate and the like are used for the material for the solvent.

In this way, a KOH group development solution, which is normally a negative development solution, can be used for the positive photo-resist containing an acrylic resin with the novolak group resin as a base. Accordingly, both the negative photo-resist and the positive photo-resist can selectively be developed by use of the KOH group development solution which is unified in the same photo development apparatus.

In the event that the positive photo-resist is developed by using the KOH group development solution, its development property might deteriorate or a development stain might be generated. Thus, a BM photo apparatus 162 is applied to the following methods to prevent the development property deterioration and the development stain.

First, as a method of using the development solution in the photo development apparatus, a puddle method of putting or dipping the photo-resist into the development solution container is used, instead of a spray method of spraying the development solution to the photo-resist. And, if the existing apparatus is for use in the spray method, the swing angle and the shower flow quantity of a nozzle are appropriately adjusted without remodeling the apparatus. For example, it is appropriate that the spray angle is controlled in the range of 45°±5°, and the shower flow quantity is controlled to be about 15 mL±2 mL.

Second, the exposure gap between the positive photo-resist and the mask is set to be a maximum approximate value. The exposure gap of the existing positive photo-resist is typically about 200~250 μm, but the exposure gap of the positive photo-resist according to the present invention is set to be smaller than that. If the exposure gap is too small, however, it may potentially cause a mask damage due to a particle. Thus, the exposure gap of about 100~200 μm is appropriate although a smaller gap can be used.

Third, the exposure amount is typically 20~30 mJ in the existing positive photo-resist. However, in the present invention, the exposure amount of the positive photo-resist in forming a pattern is set to a higher amount, e.g., to about 40~70 mJ.

Fourth, an appropriate concentration control of the KOH group development solution is required. For example, the appropriate concentration of the KOH group development solution for developing the negative photo-resist is about 0.4%. On the other hand, the appropriate concentration of the KOH group development solution for developing the positive photo-resist of the present invention is higher, e.g., about 1%, i.e., KOH:DI water=1:100.

Accordingly, when developing the positive photo-resist of the present invention with the use of the KOH group development solution, which is normally a negative development solution, the development property can be improved, and the development stain can be prevented.

FIG. 4 is a block diagram illustrating a photo development apparatus of a color filter substrate using a unified development solution according to a first embodiment of the present invention. The photo development apparatus of the color filter substrate shown in FIG. 4 includes a BM photo apparatus 162 to form a chrome black matrix and a resin black matrix, and R, G, and B photo apparatuses 164, 166, and 168 to form R, G, and B color filters, respectively. The photo development apparatus also include a development solution supplier 170 to supply a unified development solution to the BM photo apparatus 162 and to the R, G, and B photo apparatuses 164, 166, and 168. The development solution supplier 170 supplies the KOH group development solution, which maintains the concentration of about 0.4%, to each of the photo apparatuses 162 to 168.

If a separate deposition apparatus (not shown) or a coating apparatus forms a chrome layer or a black layer on the substrate and supplies it, the BM photo apparatus 162 forms a photo-resist pattern thereon by a photo process.

If the substrate having the chrome layer formed thereon is supplied, the BM photo apparatus 162 forms on the chrome layer a positive photo-resist containing an acrylic resin with the foregoing novolak group resin as its base. Then, the positive photo-resist is exposed by using a mask. At this moment, the positive photo-resist is exposed with an exposure gap of about 100~200 μm and an exposure amount of about 40~70 mJ. Subsequently, the positive photo-resist is developed by using the unified KOH group development solution, thereby forming the photo-resist pattern. As shown in FIG. 4, the KOH group development solution has its concentration controlled by an automatic concentration controller 174 which is added to the BM photo apparatus 162. The automatic concentration controller 174 adjusts the KOH development solution supplied at the concentration of about 0.4% from the development solution supplier 170 to be about 1% and then supplies it to the BM photo apparatus 162. The photo-resist pattern is developed by spraying the KOH group development solution to the positive photo-resist using a spray method or by putting the substrate having the positive photo-resist thereon into the KOH group development solution. Here, in the event that the spray method is used, the angle of the spray is about 45°±5°, and the shower flow quantity is about 15 mL±2 mL. Then, the BM photo apparatus 162 fires the photo-resist pattern formed to move it to an etching apparatus.

On the other hand, if the substrate having the black resin layer formed thereon is supplied, then the BM photo apparatus 162 forms a negative photo-resist containing the acrylic resin on top of the black resin layer. Then, a negative photo-resist is exposed with the use of a mask. At this moment, the negative photo-resist is exposed with the exposure gap of about 200~250, μm and the exposure amount of about 350 mj. Subsequently, the negative photo-resist is developed using the unified KOH group development solution supplied at the concentration of about 0.4% from the development solution supplier 170, thereby forming the photo-resist pattern. Then, the photo-resist pattern is fired and moved to the next etching apparatus.

The etching apparatus (not shown) etches the chrome layer or the black resin layer in accordance with the photo-resist pattern to form a chrome black matrix or resin black matrix. Then, the photo-resist pattern is removed by the strip apparatus (not shown).

The R photo apparatus 164 forms the R color filter at the corresponding pixel area of the substrate where the chrome or resin black matrix is formed. The R photo apparatus 164 coats the R negative photo-resist having the R pigment on the substrate where the black matrix is formed and exposes the R negative photo-resist. Then, the exposed R negative photo-resist is developed using the KOH group development solution supplied from the development solution supplier 170 and is then fired, thereby forming the R color filter.

The G photo apparatus 166 and the B photo apparatus 168 form the G color filter and the B color filter, respectively, at the corresponding pixel areas using the same photo process as the R photo apparatus 164.

The photo development apparatus of the color filter substrate according to the first embodiment of the present invention is capable of forming both the chrome black matrix and the resin black matrix with one photo apparatus by use of the unified KOH group development solution. Accordingly, a separate BM photo apparatus for forming the resin black matrix is not required. Thus, an equipment investment cost can be reduced, thereby reducing the production cost. Further, an equipment operation rate can be improved to 100%, thereby improving the productivity.

FIG. 5 is a block diagram illustrating a photo development apparatus of a color filter substrate using a unified development solution according to a second embodiment of the present invention. The photo development apparatus of the color filter substrate shown in FIG. 5 includes a BM photo apparatus 192 to form a chrome black matrix, and R, G, and B photo apparatuses 164, 166, and 168 to form R, G, and B color filters, respectively. The photo development apparatus also includes a BM/G backup photo apparatus 182 to form a black matrix and a G color filter, and a R/B backup photo apparatus 186 to form an R color filter or a B color filter. Further, the photo development apparatus includes a development solution supplier 200 to supply a unified development solution to the photo apparatuses 192, 164, 166, and 168, and the backup photo apparatuses 182 and 186. The development solution supplier 200 supplies the KOH group development solution, which maintains the concentration of about 0.4%, to each of the photo apparatuses 192, 164, 166, 168.

If a separate deposition apparatus (not shown) or a coating apparatus forms a chrome layer on the substrate and supplies it, the BM photo apparatus 192 forms a photo-resist pattern thereon by a photo process. The BM photo apparatus 192 forms a photo-resist pattern on the chrome layer using the KOH development solution and the positive photo-resist containing an acrylic resin with the novolak group resin as its base, as in the BM photo apparatus 162 shown in FIG. 4. As shown in FIG. 5, the automatic concentration controller 194 is provided to adjust the concentration of the KOH development solution supplied from the development solution supplier 200, and the concentration is adjusted to be higher before the solution is supplied to the BM photo apparatus 192.

The R photo apparatus 164 forms the R color filter at the corresponding pixel area of the substrate where the chrome black matrix is formed. The R photo apparatus 164 coats the R negative photo-resist having the R pigment on the substrate where the black matrix is formed and exposes the coated R negative photo-resist. Then, the exposed R negative photo-resist is developed by using the KOH group development solution supplied from the development solution supplier 200 and is then fired, thereby forming the R color filter.

The G photo apparatus 166 and the B photo apparatus 168 form the G color filter and the B color filter, respectively, at the corresponding pixel areas using the same photo process used by the R photo apparatus 164.

If the substrate having a chrome layer formed thereon is supplied to the BM/G backup photo apparatus 182, the BM/G backup photo apparatus 182 forms a photo-resist pattern on the chrome layer and moves the substrate to the next etching apparatus in the same manner as the BM photo apparatus 192. Further, if the substrate having the black matrix formed thereon is supplied to the BM/G backup photo apparatus 182, the BM/G backup photo apparatus 182 forms the G color filter using the same photo process as the G photo apparatus 166.

The R/B backup photo apparatus 186 forms the R color filter by the same photo process as the R photo apparatus 164, and the B color filter by the same photo process as the B photo apparatus 168.

The photo development apparatus of the color filter substrate according to the second embodiment of the present invention has any one of the two backup photo apparatuses produce the black matrix and any one of the three color filters, and the other backup photo apparatus produce the other two color filters. Thus, the production imbalance of the backup apparatuses can be prevented, and the productivity corresponding to one half of the basic photo development apparatus can be achieved.

The fabricating method for the color filter substrate and the photo development apparatus according to the embodiments of the present invention can be applied to liquid crystal panels, as well as to various other display panels having a color filter substrate.

Furthermore, the photo development apparatuses of the color filter substrate shown in FIGS. 4 and 5 may further include a negative type of photo apparatus to form an overcoat layer on the color filter and a negative type of photo apparatus to form a column spacer on the overcoat layer. The overcoat layer photo apparatus forms a negative photo-resist on the color filter and exposes it to develop it with the KOH development solution of a relatively low concentration, thereby forming the overcoat layer which flattens the color filter. The column spacer photo apparatus forms a negative photo-resist on the overcoat layer and exposes it to develop it with the KOH development solution of a relatively low concentration, thereby forming the column spacer.

As described above, the photo development apparatus and method for fabricating a color filter substrate of a display panel using the photo development apparatus according to the embodiments of the present invention use the KOH group development solution, which is normally a negative photo-resist development solution, and the positive photo-resist having the acrylic group resin with the novolak group resin as the base. This enables patterning of both the positive photo-resist and the negative photo-resist in one photo apparatus. In particular, the exposure gap, exposure amount, development solution concentration, spray angle and other characteristics can be appropriately controlled when patterning the positive photo-resist, thereby preventing the development defect and stain caused by the KOH group development solution.

Accordingly, the photo development apparatus and method for fabricating a color filter substrate of a display panel using the photo development apparatus according to the embodiments of the present invention can form the photo-resist pattern required for both the chrome black matrix and the resin black matrix with one photo apparatus. Thus, the equipment operation can be improved to 100%, and the equipment cost can be reduced.

Further, the photo development apparatus and method for fabricating a color filter substrate of a display panel using the photo development apparatus according to the embodiments of the present invention form the R, G, and B color filters and the photo-resist pattern for the chrome black matrix by adding two backup photo apparatuses and substantially equally utilizing them. Thus, the productivity can be improved, and the production imbalance of the backup photo apparatuses can be prevented.

It will be apparent to those skilled in the art that various modifications and variations can be made in the photo development apparatus and method for fabricating a color filter substrate of a display panel using the photo development apparatus according to the present invention without departing from the spirit or scope of the invention. Thus, it is intended that the present invention cover the modifications and variations of this invention provided they come within the scope of the appended claims and their equivalents.

What is claimed is:

1. A method of fabricating a color filter substrate for a display panel, comprising:

forming a light shielding layer on a substrate;
   forming a positive photo-resist including an acrylic group resin and a novolak group resin on the light shielding layer;
   exposing portions of the positive photo-resist using a mask;
   supplying a first negative development solution;
   supplying a second negative development solution by controlling a concentration of the first negative development solution;
   forming a positive photo-resist pattern by developing the exposed portions of the positive photo-resist with the second negative development solution; and
   forming a black matrix by patterning the light shielding layer using the positive photo-resist pattern.

2. The method according to claim 1, further comprising:
   forming a color negative photo-resist on the substrate and the black matrix;
   exposing portions of the color negative photo-resist using a mask; and
   forming a color filter by developing the portions of the exposed color negative photo-resist with the first negative development solution.

3. The method according to claim 2, wherein R, G, and B color filters are formed at corresponding pixel areas by repeating the forming of the color negative photo-resist, exposing of the portions of the color negative photo-resist, and developing of the exposed portions of the color negative photo-resist.

4. The method according to claim 2, further comprising:
   forming an overcoat negative photo-resist on the color filter;
   exposing portions of the overcoat negative photo-resist using a mask; and
   developing the portions of the overcoat negative photo-resist with the first negative development solution to form an overcoat layer.

5. The method according to claim 4, further comprising:
   forming a spacer negative photo-resist on the overcoat layer;
   exposing portions of the spacer negative photo-resist using a mask; and
   developing the portions of the spacer negative photo-resist with the first negative development solution to form a column spacer.

6. The method according to claim 1, wherein the first and second negative development solutions each include a KOH group development solution.

7. The method according to claim 6, wherein the first negative development solution has a KOH concentration of about 0.4%, and the second development solution has a KOH concentration of about 1%.

8. The method according to claim 1, wherein an exposure gap of the positive photo-resist is within a range of about 100 to about 200 μm.

9. The method according to claim 1, wherein an exposure amount of the positive photo-resist is within a range of about 40 to about 70 mJ.

10. The method according to claim 1, wherein the second negative development solution is supplied to the positive photo-resist by a spray method with a spray angle within a range of about 40° to about 50°.

11. The method according to claim 10, wherein a shower flow quantity of the second negative development solution is about 13 to about 17 mL.

12. The method according to claim 1, wherein the second negative development solution is supplied to the positive photo-resist by dipping the positive photo-resist in the second negative development solution.

13. The method according to claim 1, wherein the ratio of the novolak group resin to the acrylic group resin included in the positive photo-resist is within the range between about 1 to 0.4 and about 1 to 0.6.

14. The method according to claim 1, wherein the positive photo-resist has a composition of about 12% to about 17% novolak resin, about 5% to about 10% acrylic resin, about 3% to about 5% photo active compound PAC, and about 77% to about 82% solvent.

15. A method of fabricating a plurality of color filter substrates for display panels, comprising:

forming a light shielding layer on a first substrate;

forming a positive photo-resist including an acrylic group resin and a novolak group resin on the light shielding layer;

exposing portions of the positive photo-resist using a mask;

supplying a first negative development solution;

supplying a second negative development solution by controlling a concentration of the first negative development solution;

forming a positive photo-resist pattern by developing the exposed portions of the positive photo-resist with the second negative development solution;

forming a black matrix by patterning the light shielding layer using the positive photo-resist pattern, forming a black resin layer on a second substrate;

forming a negative photo-resist on the black resin layer;

exposing portions of the negative photo-resist using a mask; and developing the exposed portions of the negative photo-resist with the first negative development solution to form a black matrix on the second substrate.

* * * * *